US012607923B2

(12) United States Patent
Lee et al.

(10) Patent No.: US 12,607,923 B2
(45) Date of Patent: Apr. 21, 2026

(54) MASK AND METHOD FOR FORMING THE SAME

(71) Applicant: TAIWAN SEMICONDUCTOR MANUFACTURING COMPANY, LTD., Hsinchu (TW)

(72) Inventors: Hsin-Chang Lee, Hsinchu County (TW); Ping-Hsun Lin, New Taipei City (TW); Pei-Cheng Hsu, Taipei City (TW); Hsuan-I Wang, New Taipei City (TW); Hung-Yi Tsai, Hsinchu County (TW); Bo-Wei Shih, Changhua County (TW); Ta-Cheng Lien, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 840 days.

(21) Appl. No.: 17/879,233

(22) Filed: Aug. 2, 2022

(65) Prior Publication Data

US 2024/0045317 A1      Feb. 8, 2024

(51) Int. Cl.
*G03F 1/24*          (2012.01)

(52) U.S. Cl.
CPC ...................................... *G03F 1/24* (2013.01)

(58) Field of Classification Search
CPC ...................................... G03F 1/24; G03F 1/48
See application file for complete search history.

(56) References Cited

U.S. PATENT DOCUMENTS

| | | | | |
|---|---|---|---|---|
| 8,658,333 B2 * | 2/2014 | Chang | ....................... | G03F 1/58 |
| | | | | 430/5 |
| 8,764,995 B2 | 7/2014 | Chang et al. | | |
| 8,796,666 B1 | 8/2014 | Huang et al. | | |
| 8,828,625 B2 | 9/2014 | Lu et al. | | |
| 8,841,047 B2 | 9/2014 | Yu et al. | | |
| 8,877,409 B2 | 11/2014 | Hsu et al. | | |
| 9,093,530 B2 | 7/2015 | Huang et al. | | |
| 9,184,054 B1 | 11/2015 | Huang et al. | | |
| 9,256,123 B2 | 2/2016 | Shih et al. | | |
| 9,529,268 B2 | 12/2016 | Chang et al. | | |
| 9,548,303 B2 | 1/2017 | Lee et al. | | |
| 2004/0173907 A1 * | 9/2004 | Chen | ................. | H01L 21/76832 |
| | | | | 257/750 |
| 2017/0108768 A1 * | 4/2017 | Hsu | ...................... | H01L 21/0335 |
| 2017/0351169 A1 * | 12/2017 | Yu | .............................. | G03F 1/24 |
| 2021/0389661 A1 * | 12/2021 | Shih | ........................... | G03F 1/48 |
| 2022/0102203 A1 * | 3/2022 | Wang | ................ | H01L 21/76829 |

FOREIGN PATENT DOCUMENTS

| | | | | | |
|---|---|---|---|---|---|
| KR | 2015016056 A | * | 2/2015 | ............... | G03F 1/24 |

* cited by examiner

*Primary Examiner* — Mark F. Huff
*Assistant Examiner* — Christine Curiac
(74) *Attorney, Agent, or Firm* — Birch, Stewart, Kolasch & Birch, LLP

(57)                ABSTRACT
A method includes forming a reflective multilayer over a substrate; depositing a first capping layer over the reflective multilayer, wherein the first capping layer is made of a ruthenium-containing material or a chromium-containing material; performing a treatment to the first capping layer to introduce nitrogen or fluorine into the first capping layer; forming an absorption layer over the first capping layer; and patterning the absorption layer.

20 Claims, 16 Drawing Sheets

120

100

P1

130

120

100

M1

150

130

120

100

200

230

220

MASK AND METHOD FOR FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
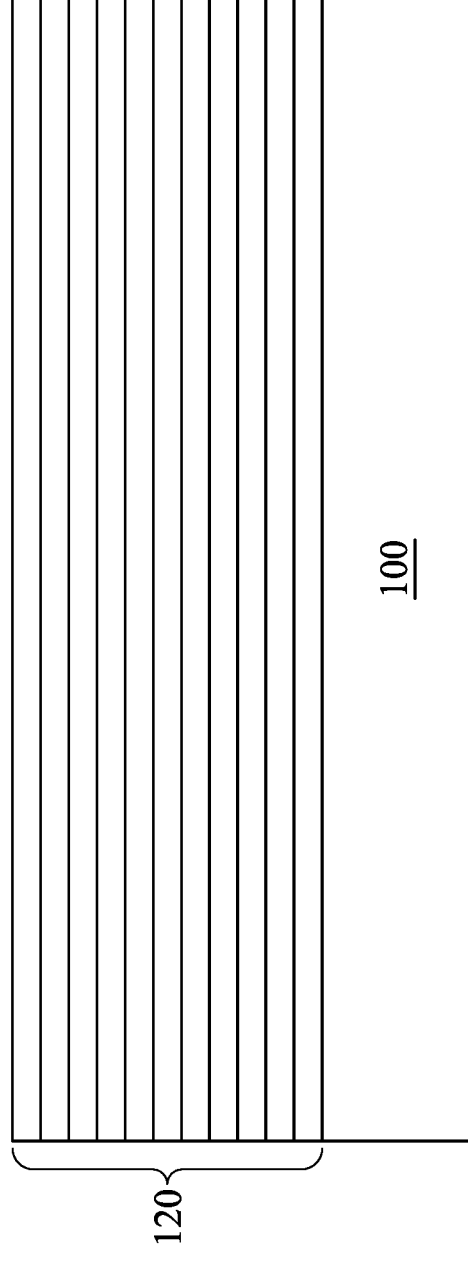
FIGS. 1 to 7 are cross-sectional views of a method for manufacturing a mask at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIGS. 1 to 7 are cross-sectional views of a method for manufacturing a mask at various stages in accordance with some embodiments of the present disclosure. The following description refers to a mask and a mask fabrication process. The mask fabrication process includes two steps: a blank mask fabrication process and a mask patterning process. During the blank mask fabrication process, a blank mask is formed by deposing suitable layers (e.g., multiple reflective layers) on a suitable substrate. The blank mask is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

Reference is made to FIG. 1. Shown there is a substrate 100. In some embodiments, the substrate 100 may be made of low thermal expansion material (LTEM). In some embodiments, the LTEM material may include quartz, silicon, silicon carbide, and silicon oxide-titanium oxide compound. Alternatively, the LTEM material may include $TiO_2$ doped $SiO_2$, and/or other low thermal expansion materials known in the art. During operation, the LTEM substrate 100 serves to reduce image distortion due to mask heating. In some embodiments, the LTEM substrate 100 includes materials with a low defect level and a smooth surface.

A reflective multilayer (ML) 120 is formed over the substrate 100. According to Fresnel equations, light reflection occurs when light propagates across the interface between two materials of different refractive indices. Light reflection is larger when the difference of refractive indices is larger. To increase light reflection, one may also increase the number of interfaces by forming a multilayer of alternating materials and let light to be reflected from different interfaces interfere constructively by choosing appropriate thickness for each layer inside the multilayer. However, the absorption of the employed materials for the multilayer limits the highest reflectivity that can be achieved. The reflective ML 120 includes a plurality of film pairs, such as molybdenum-silicon (Mo/Si) film pairs (e.g., a layer of molybdenum above or below a layer of silicon in each film pair). Alternatively, the reflective ML 120 may include molybdenum-beryllium (Mo/Be) film pairs, or any two materials or material combinations with large difference in refractive indices and small extinction coefficients. The thickness of each layer of the reflective ML 120 depends on the wavelength of the incident light and the angle of incidence on the mask. For a specified angle of incidence, the thickness of the reflective ML 120 is adjusted to achieve maximal constructive interference for lights reflected at different interfaces of the ML 120. In some embodiments, the number of film pairs of the reflective ML 120 is in a range of about 20 to about 80, however any number of film pairs is possible. In some embodiments, the reflective ML 120 includes forty pairs of layers of Mo/Si. Each Mo/Si film pair has a thickness of about 7 nm, e.g., 3 nm for Mo and 4 nm for Si. In some embodiments of the present disclosure, a reflectivity of about 70% may be achieved.

Figure 2:
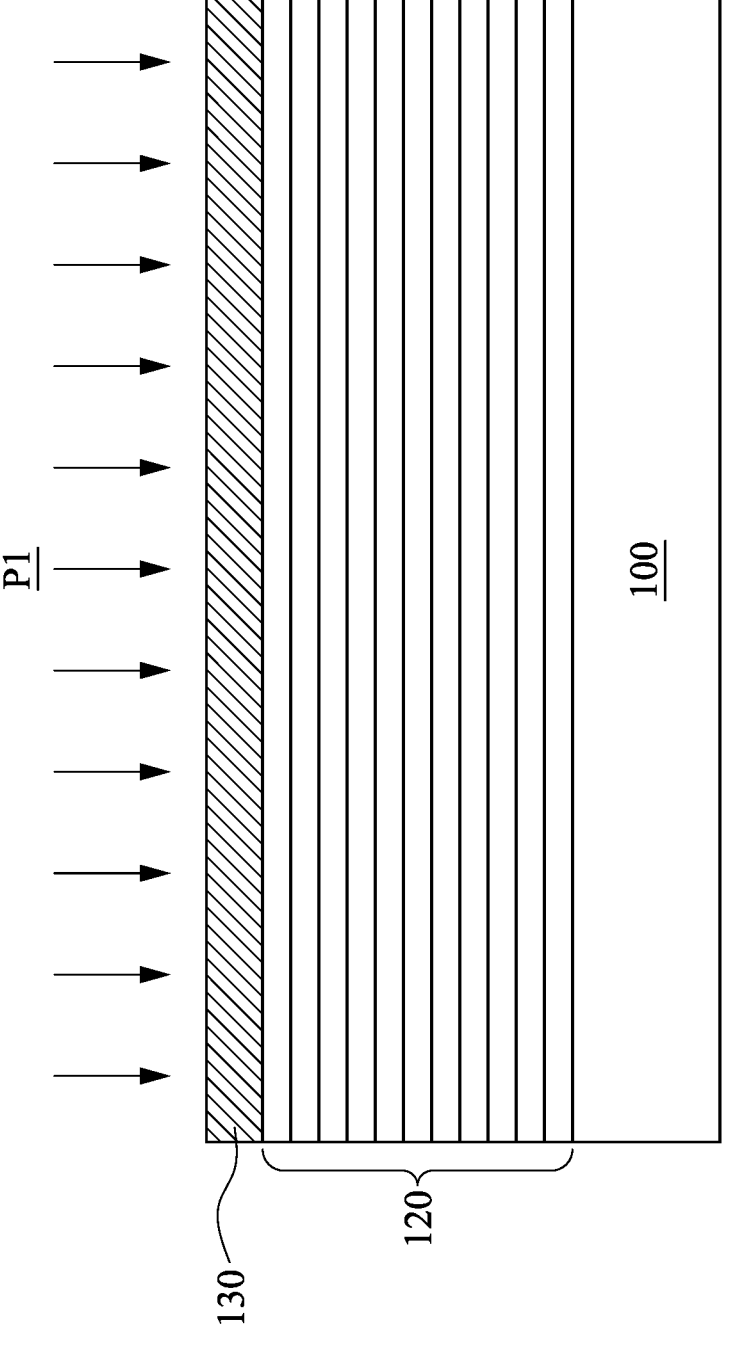

Reference is made to FIG. 2. A capping layer 130 is formed over the reflective ML 120. The capping layer 130 includes a material that protects the reflective ML 120 during processing of the mask (for example, during etching of an absorption layer of the mask). In the depicted embodiments, the capping layer 130 includes a ruthenium-containing material, such as Ru, RuNb, RuZr, RuMo, RuY, RuB, RuTi, RuLa, other ruthenium-containing material, or combinations thereof. Alternatively, the capping layer 130 includes a chromium-containing material, such as Cr, CrN, CrO, CrC, CrON, CrCN, CrOC, CrOCN, other chromium-containing material, or combinations thereof. In yet another alternative, the capping layer 130 includes materials other than ruthenium-containing materials and chromium-containing materials. The capping layer 130 may include a combination of ruthenium-containing material, chromium-containing material, and other material, for example, where the capping layer 130 includes multiple layers. In an example, the capping layer 130 has a thickness of about 2 nm to about 5 nm. includes a material that protects the reflective ML 120 during processing of the mask (for example, during etching of an absorption layer of the mask). In some embodiments, the capping layer 130 may be formed by suitable deposition process, such as a physical vapor deposition (PVD) process, a chemical vapor deposition (CVD) process, or the like.

A treatment P1 may be performed to the capping layer 130 during depositing the capping layer 130. The treatment P1 is performed to change the chemical properties of the capping layer 130. In some embodiments, the treatment P1 may include a surface pre-treatment or a doping process. In greater details, the treatment P1 is performed to introduce nitrogen (N) and/or fluorine (F) into the capping layer 130.

When the treatment P1 is a surface pre-treatment, the surface pre-treatment may include a nitridation process or a fluorination process. For example, if the capping layer 130 includes a ruthenium-containing material, the treatment P1 is performed to the capping layer 130, such that the capping layer 130 becomes a nitride of the ruthenium-containing material or a fluoride of the ruthenium-containing material. In some embodiments, the treated capping layer 130 may be a nitride or a fluoride of Ru, RuNb, RuZr, RuMo, RuY, RuB, RuTi, RuLa. In some embodiments, the treated capping layer 130 may be ruthenium nitride (RuN) or ruthenium fluoride (RuF). On the other hand, if the capping layer 130 includes a chromium-containing material, the treatment P1 is performed to the capping layer 130, such that the capping layer 130 becomes a nitride of the chromium-containing material or a fluoride of the chromium-containing material. In some embodiments, the treated capping layer 130 may be a nitride or a fluoride of Cr, CrN, CrO, CrC, CrON, CrCN, CrOC, CrOCN. In some embodiments, the treated capping layer 130 may be chromium nitride or chromium fluoride.

When the treatment P1 is a doping process, the doping process may include doping the capping layer 130 with nitrogen (N) and/or fluorine (F). For example, if the capping layer 130 includes a ruthenium-containing material, the treatment P1 is performed to the capping layer 130, such that the capping layer 130 becomes a ruthenium-containing material doped with nitrogen (N) and/or fluorine (F). In some embodiments, the treated capping layer 130 may be Ru, RuNb, RuZr, RuMo, RuY, RuB, RuTi, or RuLa doped with nitrogen (N) and/or fluorine (F). On the other hand, if the capping layer 130 includes a chromium-containing material, the treatment P1 is performed to the capping layer 130, such that the capping layer 130 becomes a chromium-containing material doped with nitrogen (N) and/or fluorine (F). In some embodiments, the treated capping layer 130 may be Cr, CrN, CrO, CrC, CrON, CrCN, CrOC, or CrOCN doped with nitrogen (N) and/or fluorine (F). In some embodiments, the dopant concentration of the nitrogen (N) or fluorine (F) in the treated capping layer 130 may be in a range from about 0% to about 50%.

Figure 3:
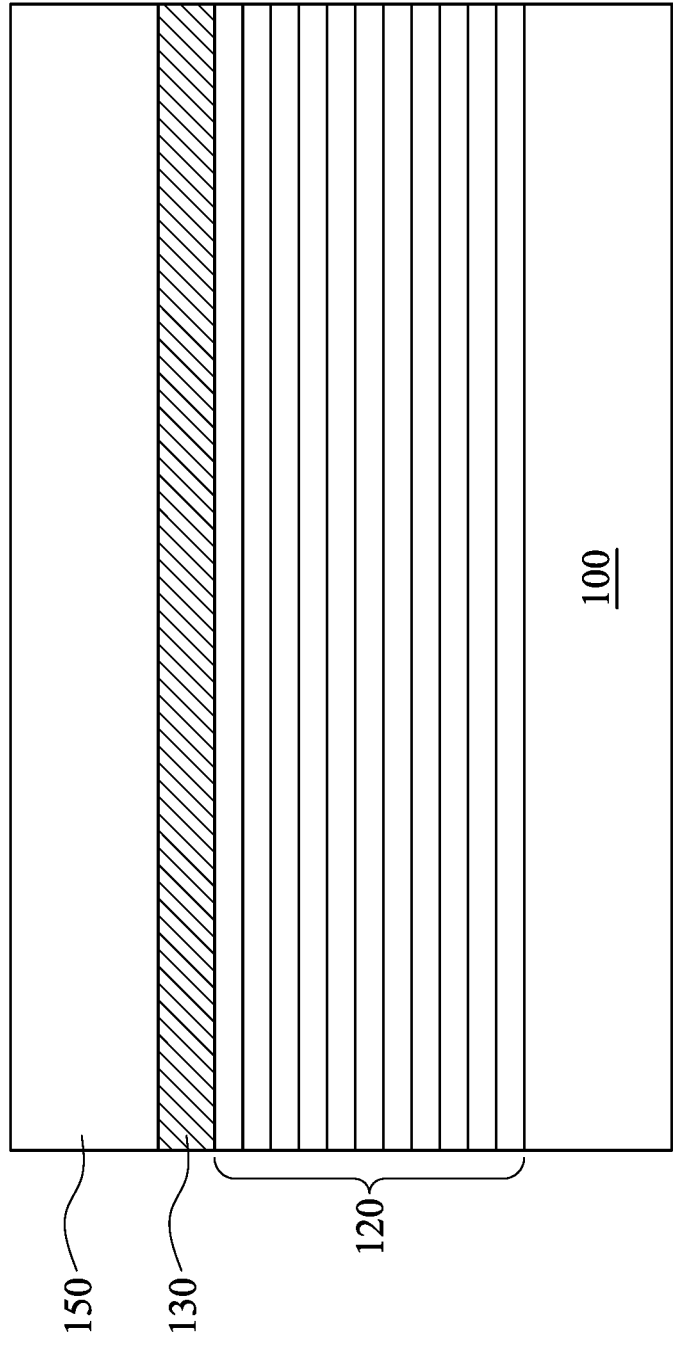

Reference is made to FIG. 3. An absorption layer 150 is disposed over the capping layer 130. The absorption layer 150 includes one or more layers designed to absorb radiation in the radiation type/wavelength range projected onto the mask. In the depicted embodiments, the one or more layers of the absorption layer 150 are designed to absorb EUV radiation. The one or more layers include various materials, such as tantalum-containing materials (for example, Ta, TaN, TaNH, TaHF, TaHfN, TaBSi, TaB—SiN, TaB, TaBN, TaSi, TaSiN, TaGe, TaGeN, TaZr, TaZrN, other tantalum-containing materials, or combinations thereof), chromium-containing materials (for example, Cr, CrN, CrO, CrC, CrON, CrCN, CrOC, CrOCN, other chromium-containing material, or combinations thereof), titanium-containing materials (for example, Ti, TiN, other titanium-containing material, or combinations thereof), other suitable materials, or combinations thereof. A configuration of the one or more layers (such as material composition of the one or more layers) is selected to provide process flexibility during fabrication of the mask 100. For example, etching characteristics of the one or more layers of the absorption layer 150 provide process flexibility, which can reduce manufacturing time and costs.

According to the above descriptions, one or more of the reflective ML 120, the capping layer 130, and the absorption layer 150 may be formed by various methods, including physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other suitable methods.

Figure 4:
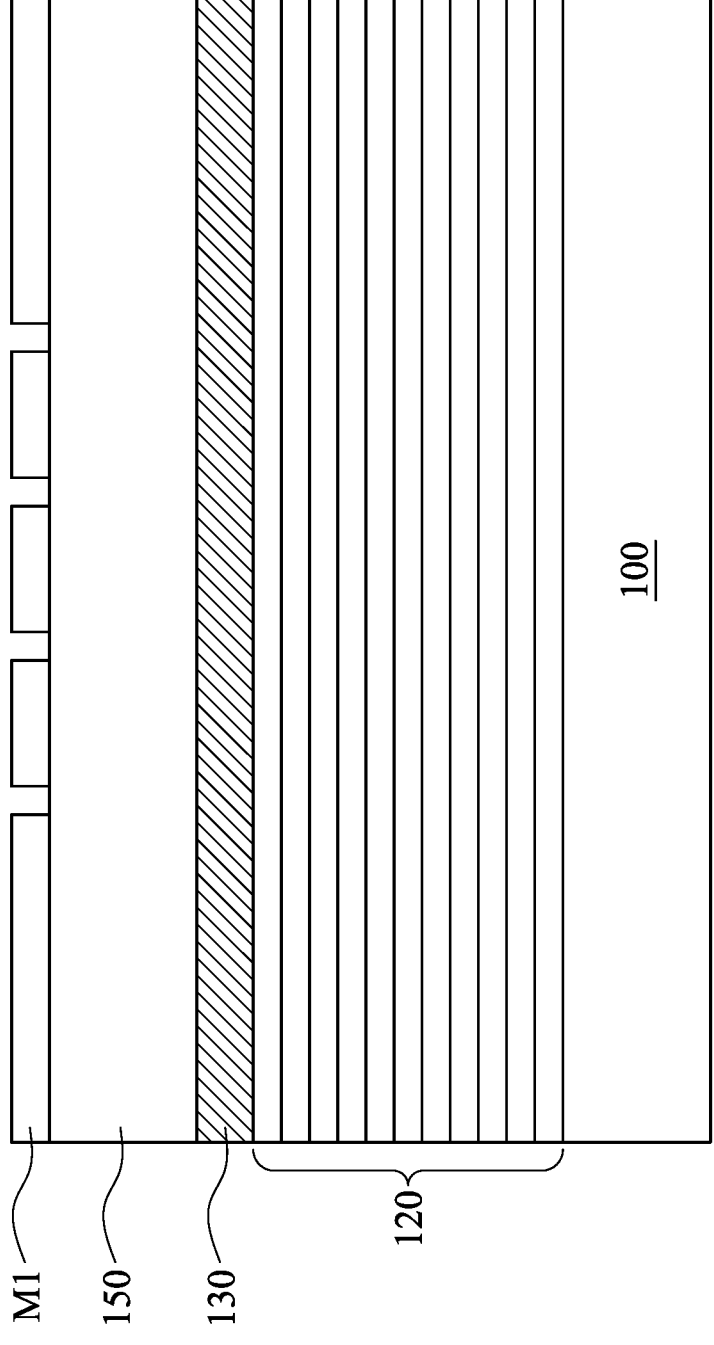

Reference is made to FIG. 4. A photoresist layer M1 is formed on the absorption layer 150. In some embodiments, the photoresist layer M1 may be a laser beam resist, and the photoresist layer may be formed by suitable method such as spin-on coating. Then, the photoresist layer M1 is patterned based on a received design layout. In some embodiments, the photoresist layer M1 is patterned using an electron beam (e-beam) writer. Other patterning techniques that may be used in conjunction with or as a replacement for e-beam writing include ion-beam writing and masked and maskless photolithography. Additionally, any other suitable patterning technique may be used. Patterning the photoresist layer may include soft baking, mask aligning, exposure, post-exposure baking, developing the photoresist, rinsing, drying (e.g., hard baking), other suitable processes, and/or combinations thereof.

Figure 5:
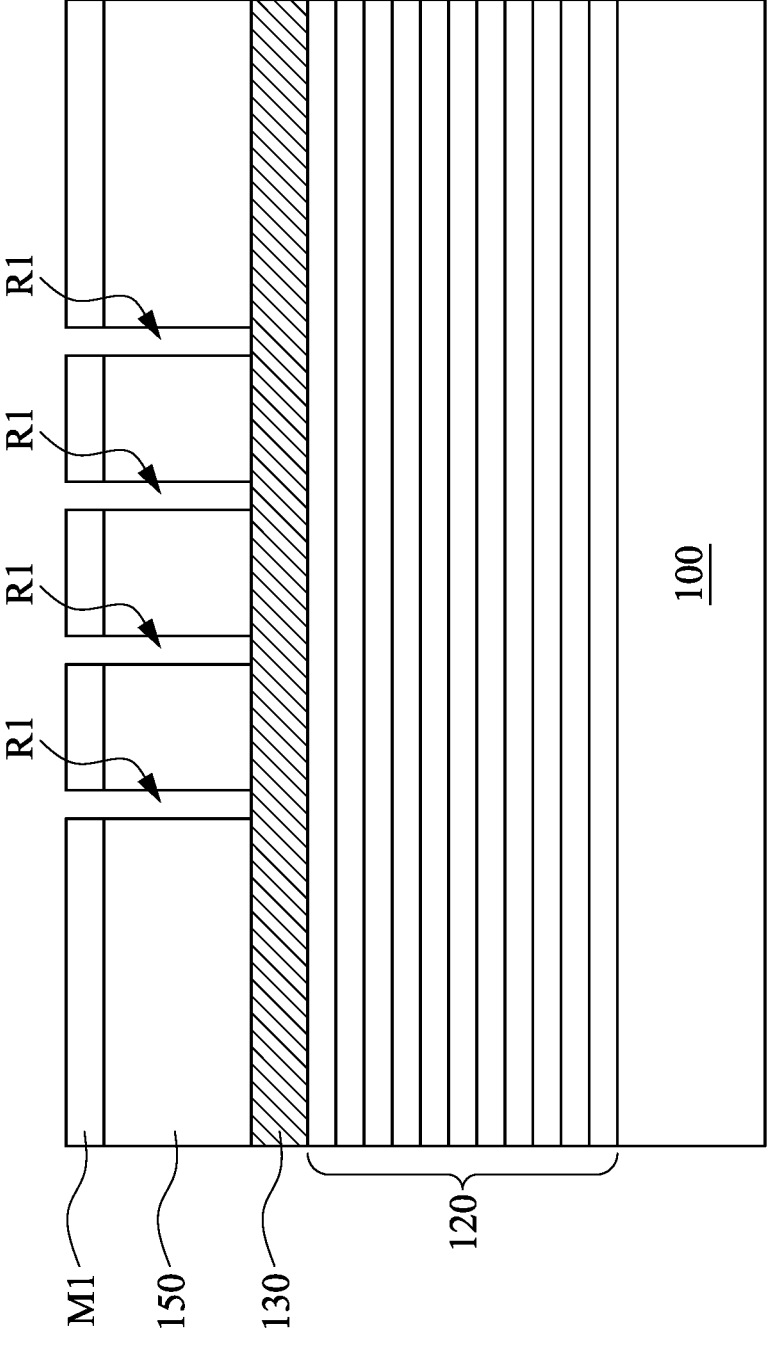

Reference is made to FIG. 5. The absorption layer 150 is patterned. In some embodiments where the photoresist layer M1 is formed, the absorption layer 150 is patterned using the photoresist layer M1 as a mask to form a plurality of recesses R1 therein. This process may be referred to as a pattern transfer, in that the pattern of the photoresist layer M1 is transferred to the absorption layer 150. In some embodiments, patterning the absorption layer 150 includes one or more etching processes to selectively remove portions of the absorption layer 150 until the capping layer 130 is exposed. The etching processes may include dry etching, wet etching, and/or other etching methods.

Figure 6:
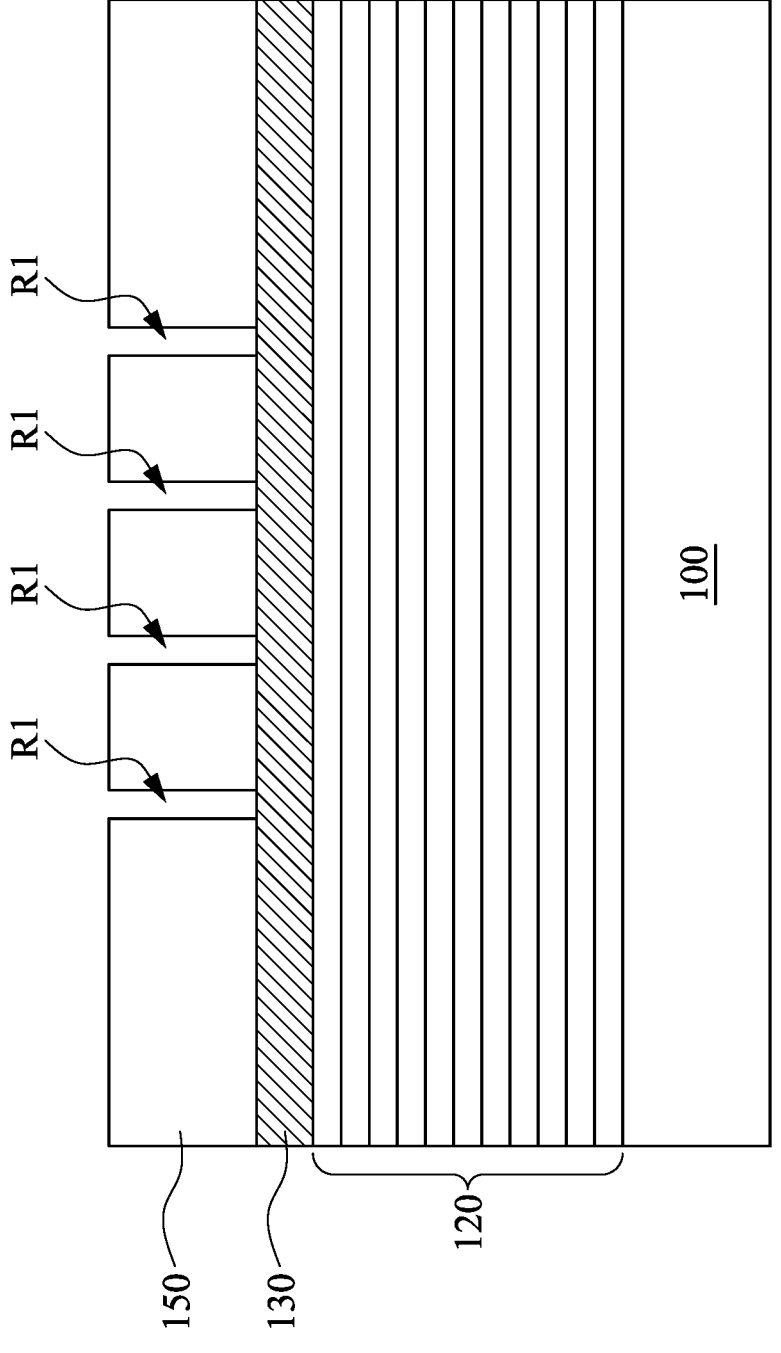

Reference is made to FIG. 6. The photoresist layer M1 (see FIG. 5) is stripped from the absorption layer 150.

Figure 7:
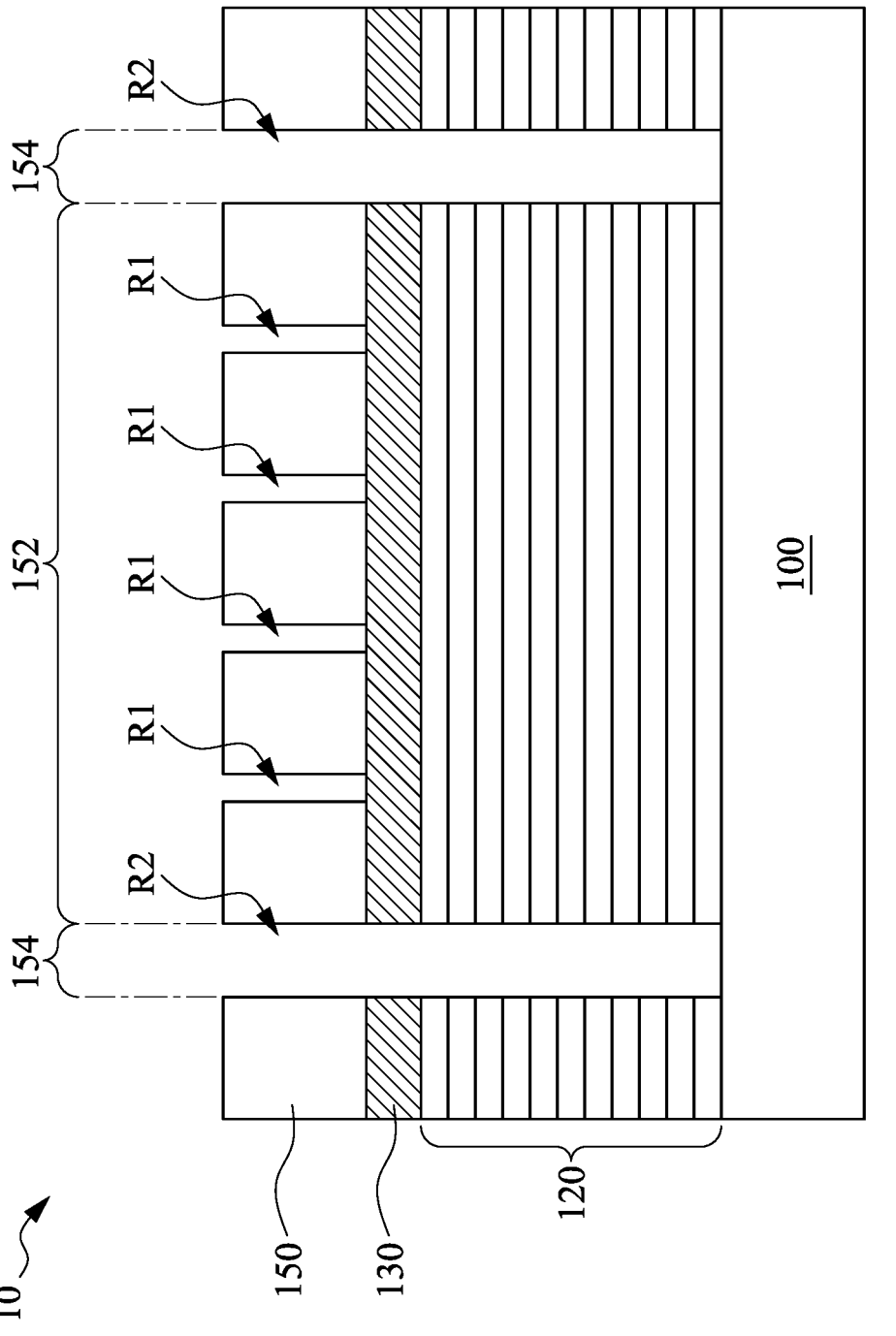

Reference is made to FIG. 7. The absorption layer 150, the capping layer 130, and the reflective ML 120 are patterned to form a plurality of recesses R2 therein. As a result, a mask 10 is formed. In some embodiments, the absorption layer 150, the capping layer 130, and the reflective ML 120 are patterned by, for example, forming a patterned photoresist layer (not shown) over the absorption layer 150, etching the absorption layer 150, the capping layer 130, and the reflective ML 120 until the substrate 100 is exposed, and then removing the patterned photoresist layer. The absorption layer 150, the capping layer 130, and the reflective ML 120 may be patterned via a multistep etching process or a single step etching process. In an exemplary single step etching process, a dry etching is performed using fluorine-containing gas chemistry such as $CF_4$, $SF_6$, $NF_3$, and/or any other suitable gas. In some other embodiments, the patterning process may be controlled such that the recesses R2 may extend into the reflective ML 120 but not expose the substrate 100.

In some embodiments, the mask 10 includes a mask image region 152 and a black border region 154 surrounding the mask image region 152. During operation, the mask 10 is used to transfer the pattern of the mask image region 152 to a wafer. For example, during an exposure process, light (radiation) is projected onto the mask 10, and a portion of the light is transmitted to the wafer, thereby transferring the pattern of the mask image region 152 to the wafer.

In some embodiments, the mask image region 152 of the mask 10 is defined by the recesses R1 formed in the absorption layer 150, in which the recesses R1 expose the top surface of the capping layer 130. On the other hands, the black border region 154 of the mask 10 is defined by the recesses R2 formed in the absorption layer 150, the capping layer 130, and the reflective ML 120. In some embodiments shown in FIG. 7, the recesses R2 extend into the reflective ML 120 and expose the top surface of the substrate 100. That is, the recesses R2 are deeper than the recesses R1.

During the exposure process of the mask, exposure light may leak to adjacent regions. Such light leakage can be attributed to light diffraction phenomenon, positional accuracy of the mask with respect to the wafer, positional accuracy of the mask with respect to the exposure tool, other phenomena, or combinations thereof. For example, light leakage may result from positional accuracy of the mask with respect to the exposure tool, such as the stepper or the scanner. For example, for each exposure process, the exposure tool defines a portion of the mask 10 for exposing light thereon. An exposure slit of the exposure tool (defined by blades of the exposure tool, in an example) may define the portion of the mask 10 that will be exposed to the light. Ideally, the light exposes the mask image region 152 of the mask 10. Typically, however, the exposure slit will expose an area of the mask 10 outside the mask image region 152. In some embodiments of the present disclosure, the mask black border region 154 of the mask 10 represents an area of the mask 10 that is outside the mask image region 152 that will be exposed to the light (in other words, an area of the mask 10 outside the mask image region that is not covered by the exposure tool). Here, the mask black border region 154 of the mask 10 is adjacent to the mask image region 152. Because the mask black border region 154 of the mask 10 is exposed to light during the exposure process, the mask black border region 154 undesirably transmits a portion of light to the wafer, resulting in some regions receiving double exposure and corners of the fields receiving quadruple exposure. To remedy such light leakage, reflectivity of the mask black border region 154 of the mask 10 is minimized to reduce such unwanted exposure. For example, the profile of the mask black border region 154 is configured to allow radiation to be transmitted through the recesses R2 to a deeper structure of the mask 10 such as the substrate 100. In some embodiments, the recesses R2 expose the substrate 100 that is made of LTEM material. Because the LTEM material has a property that can absorb the incident radiation, the reflectivity of the black border region 154 may be reduced, accordingly.

FIGS. 8 to 14 are cross-sectional views of a method for manufacturing a mask at various stages in accordance with some embodiments of the present disclosure.

Figure 8:
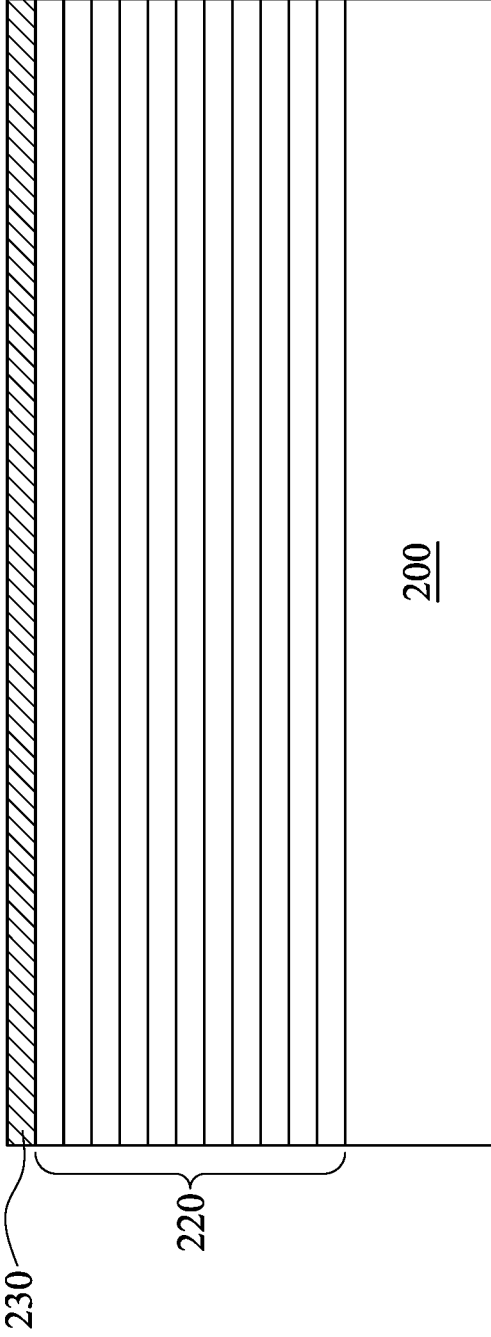
FIGS. 8 to 14 are cross-sectional views of a method for manufacturing a mask at various stages in accordance with some embodiments of the present disclosure.

Reference is made to FIG. 8. Shown there is a substrate 200. In some embodiments, the substrate 200 may be made of low thermal expansion material (LTEM). In some embodiments, the LTEM material may include quartz, silicon, silicon carbide, and silicon oxide-titanium oxide compound. Alternatively, the LTEM material may include $TiO_2$ doped $SiO_2$, and/or other low thermal expansion materials known in the art. During operation, the LTEM substrate 200 serves to reduce image distortion due to mask heating. In some embodiments, the LTEM substrate 200 includes materials with a low defect level and a smooth surface.

A reflective multilayer (ML) 220 is formed over the substrate 200. According to Fresnel equations, light reflection occurs when light propagates across the interface between two materials of different refractive indices. Light reflection is larger when the difference of refractive indices is larger. To increase light reflection, one may also increase the number of interfaces by forming a multilayer of alternating materials and let light to be reflected from different interfaces interfere constructively by choosing appropriate thickness for each layer inside the multilayer. However, the absorption of the employed materials for the multilayer limits the highest reflectivity that can be achieved. The reflective ML 220 includes a plurality of film pairs, such as molybdenum-silicon (Mo/Si) film pairs (e.g., a layer of molybdenum above or below a layer of silicon in each film pair). Alternatively, the reflective ML 220 may include molybdenum-beryllium (Mo/Be) film pairs, or any two materials or material combinations with large difference in refractive indices and small extinction coefficients. The thickness of each layer of the reflective ML 220 depends on the wavelength of the incident light and the angle of incidence on the mask. For a specified angle of incidence, the thickness of the reflective ML 220 is adjusted to achieve maximal constructive interference for lights reflected at different interfaces of the ML 220. In some embodiments, the number of film pairs of the reflective ML 220 is in a range of about 20 to about 80, however any number of film pairs is possible. In some embodiments, the reflective ML 220 includes forty pairs of layers of Mo/Si. Each Mo/Si film pair has a thickness of about 7 nm, e.g., 3 nm for Mo and 4 nm for Si. In some embodiments of the present disclosure, a reflectivity of about 70% may be achieved.

A capping layer 230 is formed over the reflective ML 220. The capping layer 230 includes a material that protects the reflective ML 220 during processing of the mask (for example, during etching of an absorption layer of the mask). In the depicted embodiments, the capping layer 230 includes a ruthenium-containing material, such as Ru, RuNb, RuZr, RuMo, RuY, RuB, RuTi, RuLa, other ruthenium-containing material, or combinations thereof. Alternatively, the capping layer 230 includes a chromium-containing material, such as Cr, CrN, CrO, CrC, CrON, CrCN, CrOC, CrOCN, other chromium-containing material, or combinations thereof. In yet another alternative, the capping layer 230 includes materials other than ruthenium-containing materials and chromium-containing materials. The capping layer 230 may include a combination of ruthenium-containing material, chromium-containing material, and other material, for example, where the capping layer 230 includes multiple layers. In an example, the capping layer 230 has a thickness of about 2 nm to about 5 nm.

Figure 9:
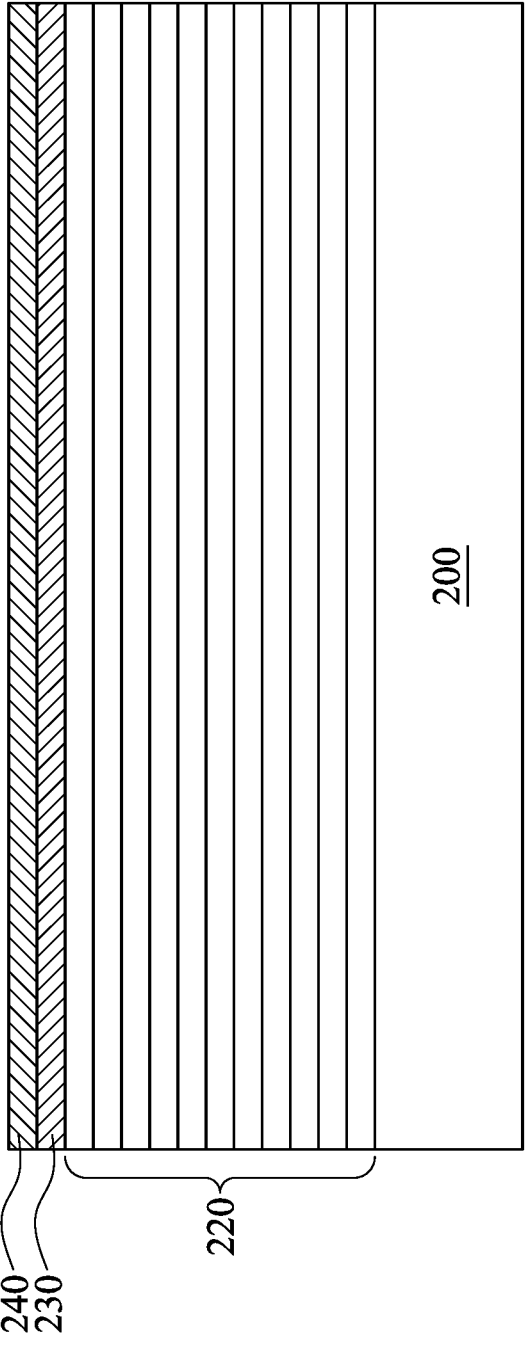

Reference is made to FIG. 9. A joining layer 240 is formed over the capping layer 230. In some embodiments, the joining layer 240 includes a ruthenium-containing material or a chromium-containing material, which may be similar to the material of the capping layer 230. Accordingly, the capping layer 230 may be referred to as a first capping layer, and the joining layer 240 may be referred to as a second capping layer. In some embodiments, the joining layer 240 may be formed by suitable deposition process, such as a physical vapor deposition (PVD) process, a chemical vapor deposition (CVD) process, or the like.

However, during depositing the joining layer 240, a treatment may be performed to the joining layer 240, so as to change the chemical properties of the joining layer 240. As a result, the joining layer 240 may become a chemically stable layer to protect the underlying capping layer 230. In some embodiments, the treatment may include a surface pre-treatment or a doping process.

When the treatment is a surface pre-treatment, the surface pre-treatment may include a nitridation process or a fluorination process. For example, if the joining layer 240 includes a ruthenium-containing material, the treatment is performed to the joining layer 240, such that the joining layer 240 becomes a nitride of the ruthenium-containing material or a fluoride of the ruthenium-containing material. In some embodiments, the treated joining layer 240 may be a nitride or a fluoride of Ru, RuNb, RuZr, RuMo, RuY, RuB, RuTi, RuLa. In some embodiments, the treated joining layer 240 may ruthenium nitride (RuN) or ruthenium fluoride (RuF). On the other hand, if the joining layer 240 includes a chromium-containing material, the treatment is performed to the joining layer 240, such that the joining layer 240 becomes a nitride of the chromium-containing material or a fluoride of the chromium-containing material. In some embodiments, the treated joining layer 240 may be a nitride or a fluoride of Cr, CrN, CrO, CrC, CrON, CrCN, CrOC, CrOCN. In some embodiments, the treated joining layer 240 may chromium nitride or chromium fluoride.

When the treatment is a doping process, the doping process may include doping the joining layer 240 with nitrogen (N) and/or fluorine (F). For example, if the joining layer 240 includes a ruthenium-containing material, the treatment is performed to the joining layer 240, such that the joining layer 240 becomes a ruthenium-containing material doped with nitrogen (N) and/or fluorine (F). In some embodiments, the treated joining layer 240 may be Ru, RuNb, RuZr, RuMo, RuY, RuB, RuTi, or RuLa doped with nitrogen (N) and/or fluorine (F). On the other hand, if the joining layer 240 includes a chromium-containing material, the treatment is performed to the joining layer 240, such that the joining layer 240 becomes a chromium-containing material doped with nitrogen (N) and/or fluorine (F). In some embodiments, the treated joining layer 240 may be Cr, CrN, CrO, CrC, CrON, CrCN, CrOC, or CrOCN doped with nitrogen (N) and/or fluorine (F). In some embodiments, the dopant concentration of the nitrogen (N) or fluorine (F) in the treated joining layer 240 may be in a range from about 0% to about 50%.

In some embodiments, both of the capping layer 230 and the joining layer 240 may be a metal-containing material. For example, both of the capping layer 230 and the joining layer 240 may be a ruthenium-containing material or a chromium-containing material. That is, the capping layer 230 and the joining layer 240 may include the same metal element, such as ruthenium or chromium. In some other embodiments, the capping layer 230 and the joining layer 240 may include different metal-containing materials. For example, the capping layer 230 may be a chromium-containing material and the joining layer 240 may be a ruthenium-containing material. Alternatively, the capping layer 230 may be a ruthenium-containing material and the joining layer 240 may be a chromium-containing material.

However, the joining layer 240 may be a nitride of the ruthenium-containing material or a chromium-containing material, or may be a fluoride of the ruthenium-containing material or a chromium-containing material. That is, the capping layer 230 may be free of nitrogen or fluorine. Stated another way, the joining layer 240 may include higher atomic concentration of nitrogen or fluorine than the capping layer 230. In some other embodiments, the joining layer 240 may be a ruthenium-containing material or a chromium-containing material doped with nitrogen (N) and/or fluorine (F). That is, the capping layer 230 may be free of nitrogen or fluorine. Stated another way, the joining layer 240 may include higher dopant concentration of nitrogen or fluorine than the capping layer 230.

In some embodiments, the joining layer 240 may be a nitride or fluoride of a material of the capping layer 230. In some other embodiments, the joining layer 240 and the capping layer 230 may be made of a same material, while the joining layer 240 may be doped with nitrogen (N) and/or fluorine (F).

In some other embodiments, the capping layer 230 may also undergo the treatment P1 as described with respect to FIG. 2. That is, the capping layer 230 may undergo a nitridation process or a fluorination process, or may undergo a doping process as described with respect to FIG. 2.

Figure 10:
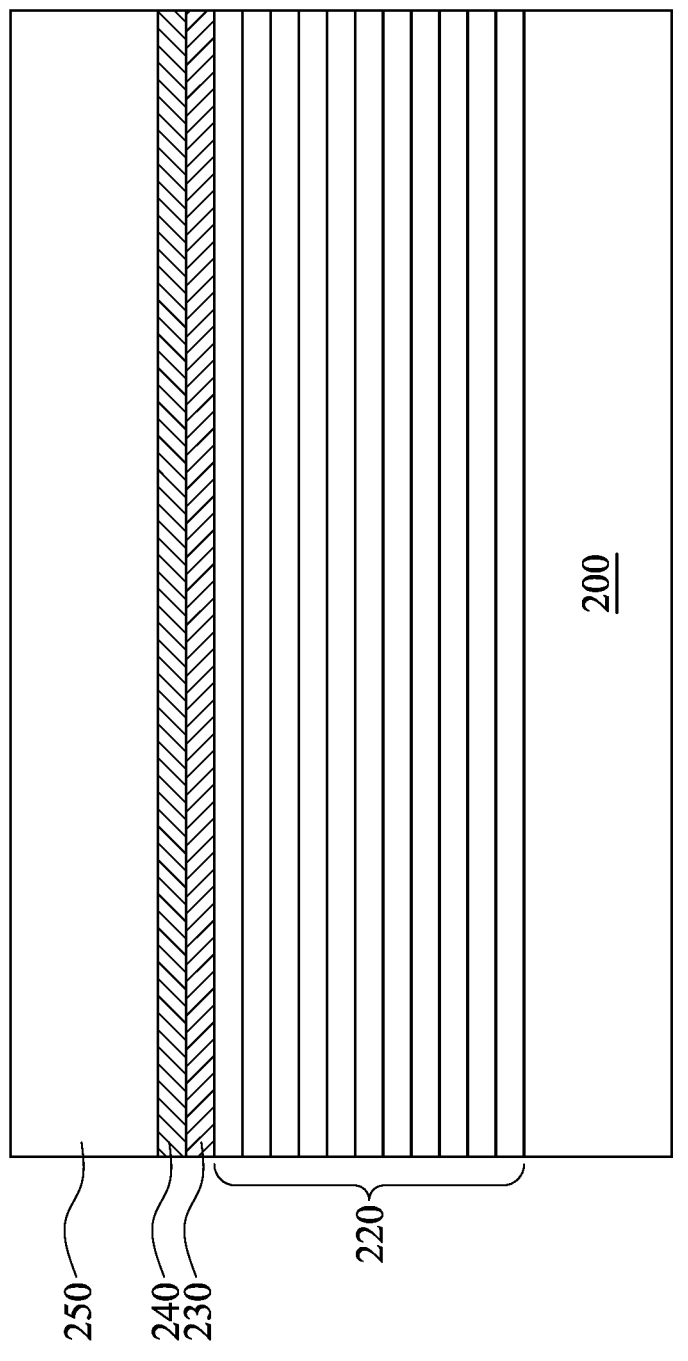

Reference is made to FIG. 10. An absorption layer 250 is disposed over the joining layer 240. The absorption layer 250 includes one or more layers designed to absorb radiation in the radiation type/wavelength range projected onto the mask. In the depicted embodiments, the one or more layers of the absorption layer 250 are designed to absorb EUV radiation. The one or more layers include various materials, such as tantalum-containing materials (for example, Ta, TaN, TaNH, TaHF, TaHfN, TaBSi, TaB—SiN, TaB, TaBN, TaSi, TaSiN, TaGe, TaGeN, TaZr, TaZrN, other tantalum-containing materials, or combinations thereof), chromium-containing materials (for example, Cr, CrN, CrO, CrC, CrON, CrCN, CrOC, CrOCN, other chromium-containing material, or combinations thereof), titanium-containing materials (for example, Ti, TiN, other titanium-containing material, or combinations thereof), other suitable materials, or combinations thereof. A configuration of the one or more layers (such as material composition of the one or more layers) is selected to provide process flexibility during fabrication of the mask 100. For example, etching characteristics of the one or more layers of the absorption layer 250 provide process flexibility, which can reduce manufacturing time and costs.

According to the above descriptions, one or more of the reflective ML 220, the capping layer 230, the capping layer 230, the joining layer 240, and the absorption layer 250 may be formed by various methods, including physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other suitable methods.

Figure 11:
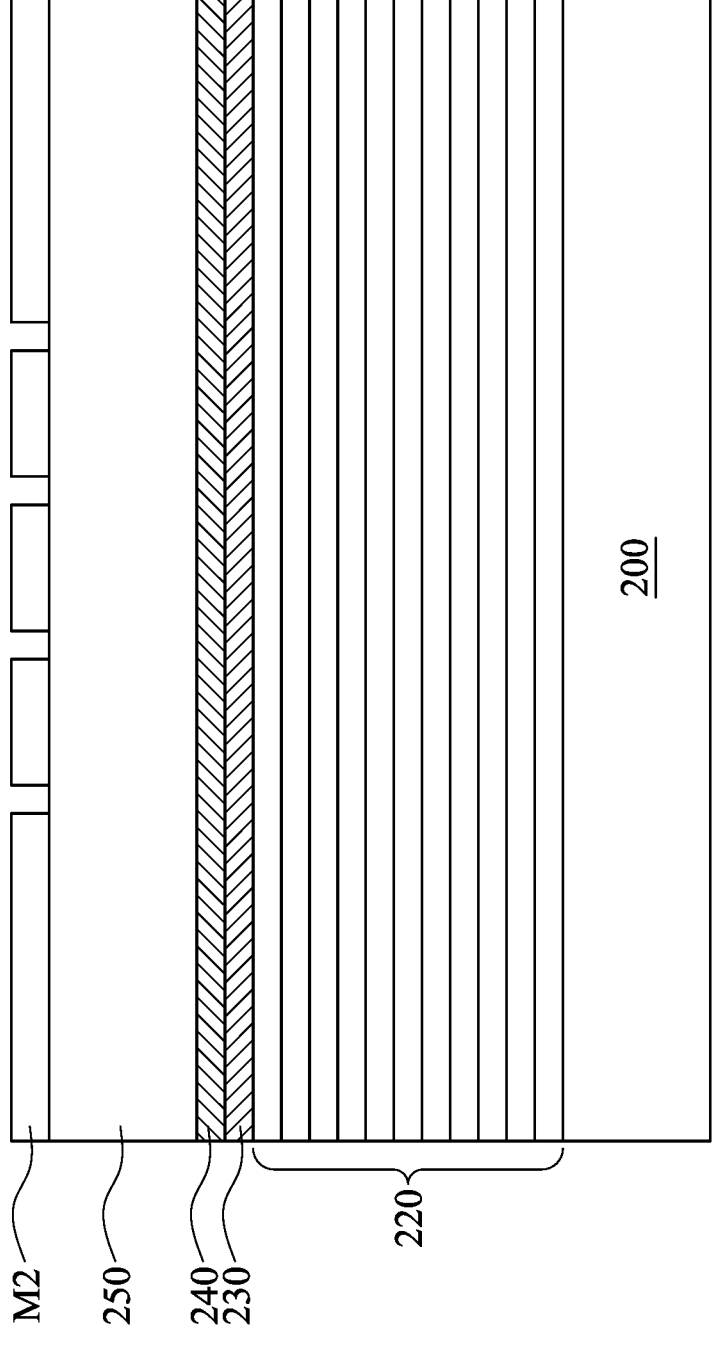

Reference is made to FIG. 11. A photoresist layer M2 is formed on the absorption layer 250. In some embodiments, the photoresist layer M2 may be a laser beam resist, and the photoresist layer may be formed by suitable method such as spin-on coating. Then, the photoresist layer M2 is patterned based on a received design layout. In some embodiments, the photoresist layer M2 is patterned using an electron beam (e-beam) writer. Other patterning techniques that may be used in conjunction with or as a replacement for e-beam writing include ion-beam writing and masked and maskless photolithography. Additionally, any other suitable patterning technique may be used. Patterning the photoresist layer may include soft baking, mask aligning, exposure, post-exposure baking, developing the photoresist, rinsing, drying (e.g., hard baking), other suitable processes, and/or combinations thereof.

Figure 12:
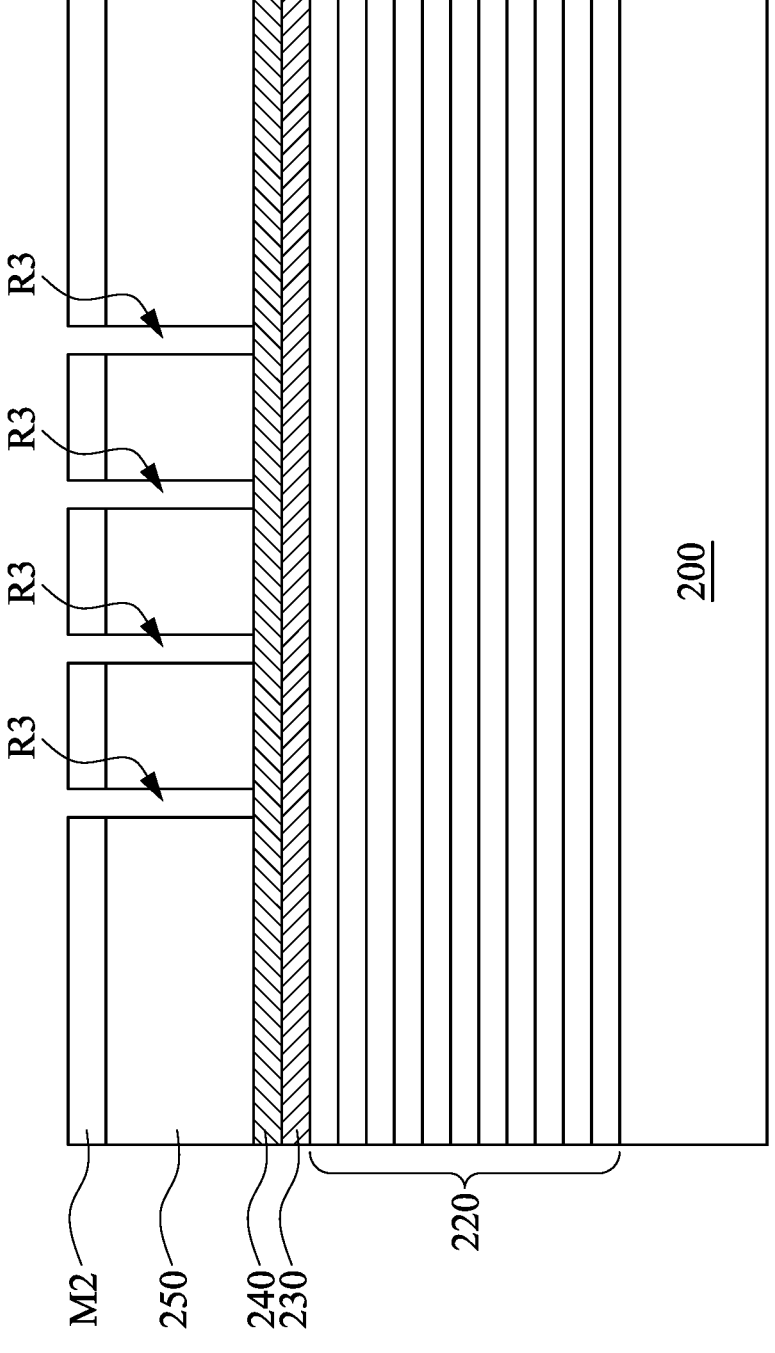

Reference is made to FIG. 12. The absorption layer 250 is patterned. In some embodiments where the photoresist layer M2 is formed, the absorption layer 250 is patterned using the photoresist layer M2 as a mask to form a plurality of recesses R3 therein. This process may be referred to as a pattern transfer, in that the pattern of the photoresist layer M2 is transferred to the absorption layer 250. In some embodiments, patterning the absorption layer 250 includes one or more etching processes to selectively remove portions of the absorption layer 250 until the joining layer 240 is exposed. The etching processes may include dry etching, wet etching, and/or other etching methods.

Figure 13:
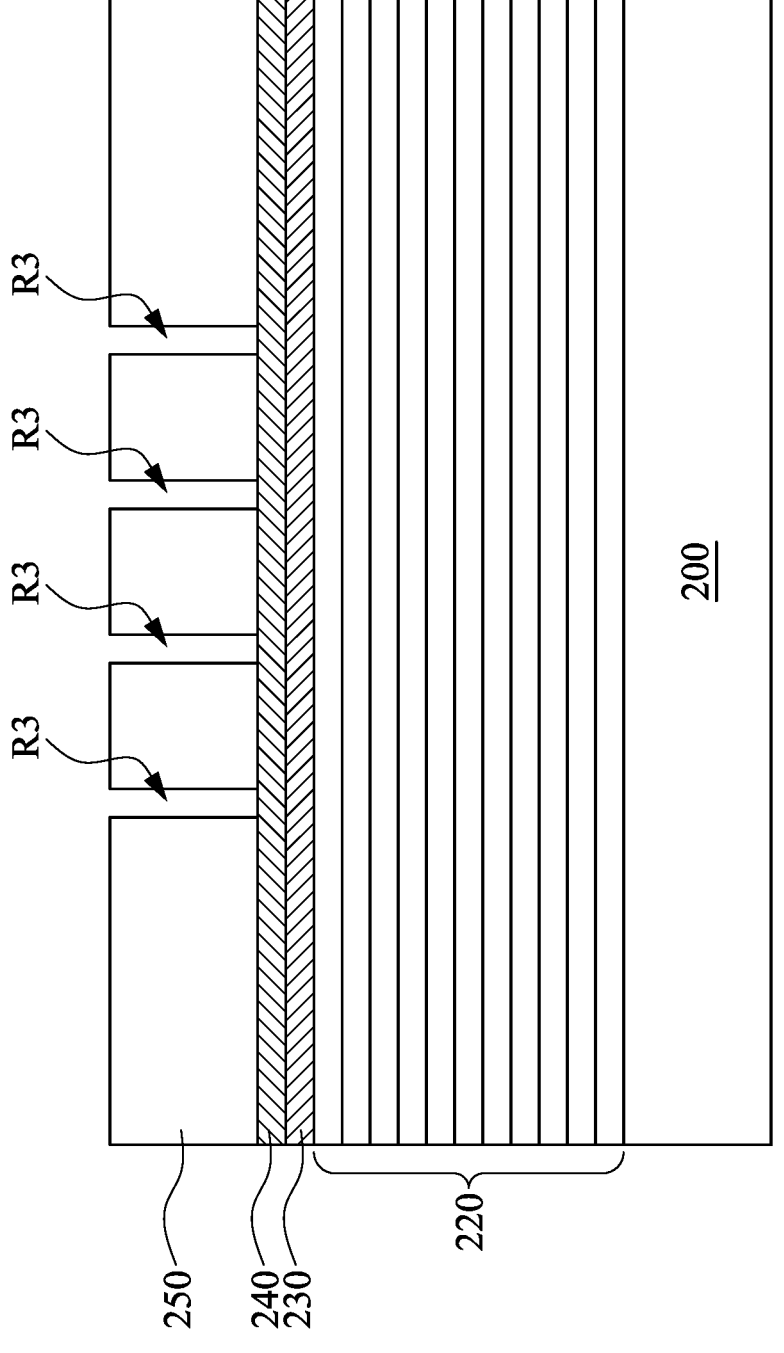

Reference is made to FIG. 13. The photoresist layer M2 (see FIG. 12) is stripped from the absorption layer 250.

Figure 14:
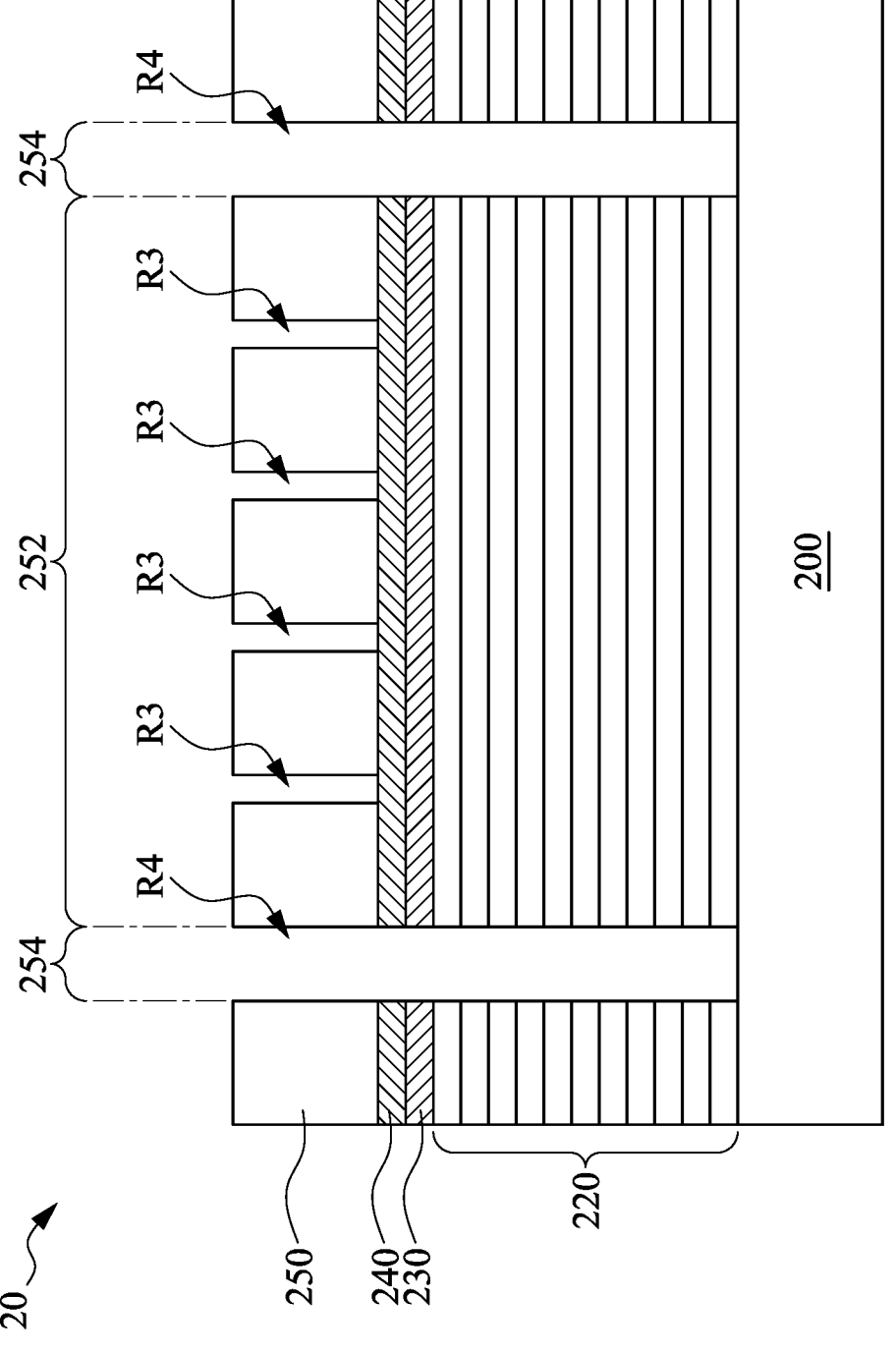

Reference is made to FIG. 14. The absorption layer 250, the capping layer 230, the joining layer 240, and the reflective ML 220 are patterned to form a plurality of recesses R4 therein. As a result, a mask 20 is formed. In some embodiments, the absorption layer 250, the capping layer 230, the joining layer 240, and the reflective ML 220 are patterned by, for example, forming a patterned photoresist layer (not shown) over the absorption layer 250, etching the absorption layer 250, the capping layer 230, the joining layer 240, and the reflective ML 220 until the substrate 200 is exposed, and then removing the patterned photoresist layer. The absorption layer 250, the capping layer 230, the joining layer 240, and the reflective ML 220 may be patterned via a multistep etching process or a single step etching process. In an exemplary single step etching process, a dry etching is performed using fluorine-containing gas chemistry such as $CF_4$, $SF_6$, $NF_3$, and/or any other suitable gas. In some other embodiments, the patterning process may be controlled such that the recesses R4 may extend into the reflective ML 220 but not expose the substrate 200.

In some embodiments, the mask 20 includes a mask image region 252 and a black border region 254 surrounding the mask image region 252. During operation, the mask 20 is used to transfer the pattern of the mask image region 252 to a wafer. For example, during an exposure process, light (radiation) is projected onto the mask 20, and a portion of the light is transmitted to the wafer, thereby transferring the pattern of the mask image region 252 to the wafer.

In some embodiments, the mask image region 252 of the mask 20 is defined by the recesses R3 formed in the absorption layer 250, in which the recesses R3 expose the top surface of the joining layer 240. On the other hands, the black border region 254 of the mask 20 is defined by the recesses R4 formed in the absorption layer 250, the joining layer 240, the capping layer 230, and the reflective ML 220. In some embodiments shown in FIG. 14, the recesses R4 extend into the reflective ML 220 and expose the top surface of the substrate 200. That is, the recesses R4 are deeper than the recesses R3.

Figure 15:
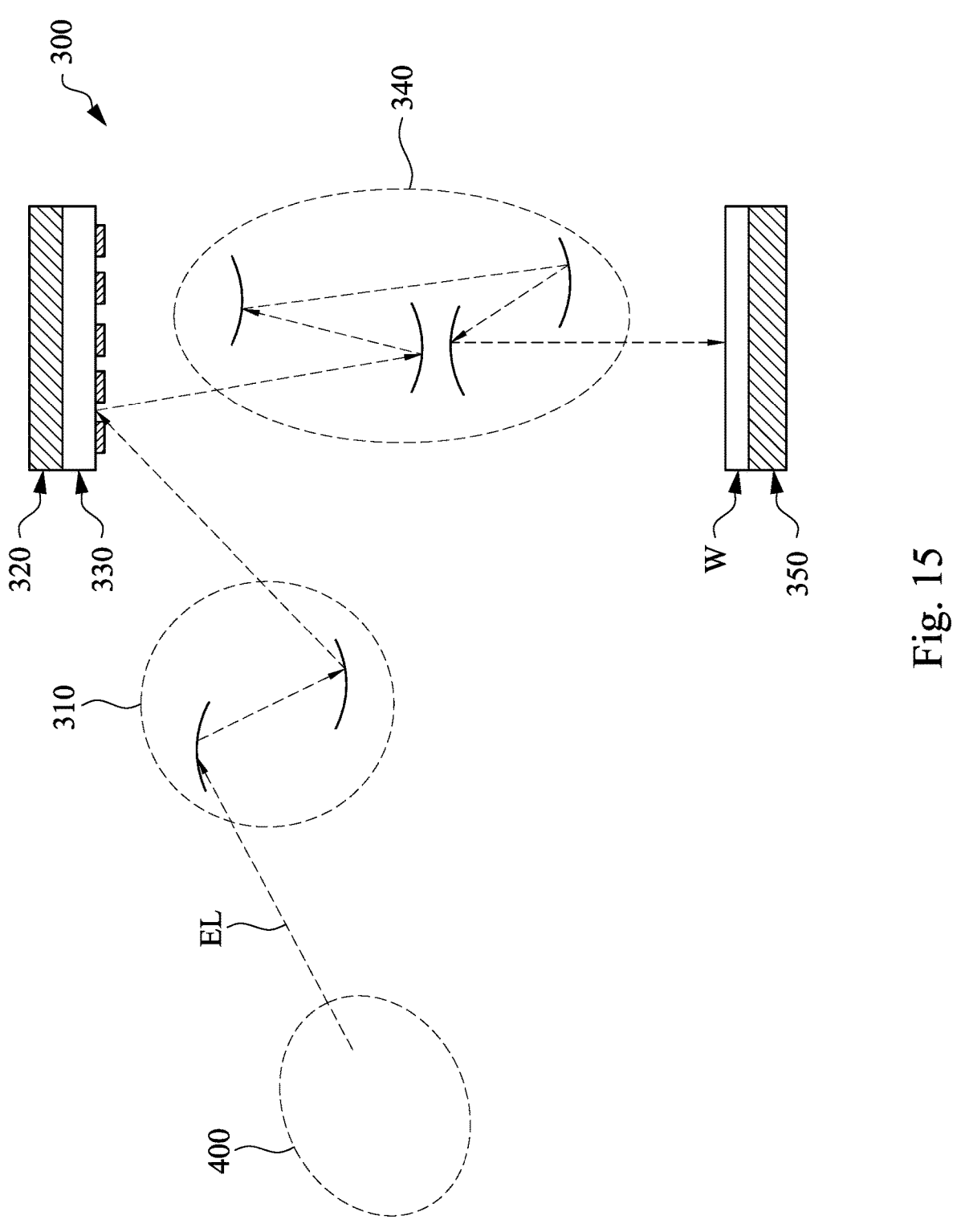
FIG. 15 is a schematic view of a lithography system according to some embodiments of the present disclosure.

FIG. 15 is a schematic view of a lithography system according to some embodiments of the present disclosure. In some embodiments, the EUV lithography system 300 is designed to expose a resist layer using EUV light (or EUV radiation). The resist layer is a material sensitive to the EUV light. The EUV lithography system 300 employs a radiation source 400 to generate EUV light EL, such as EUV light having a wavelength ranging between about 1 nm and about 100 nm. In some embodiments, the EUV light EL has a wavelength range centered at about 13.5 nm. Accordingly, the radiation source 400 is also referred to as an EUV radiation source 400. The EUV radiation source 400 may utilize a mechanism of laser-produced plasma (LFF) to generate the EUV radiation, which will be further described later.

The EUV lithography system 300 also employs an illuminator 310. In some embodiments, the illuminator 310 includes various reflective optics, such as a single mirror or a mirror system having multiple mirrors, so as to direct the light EL from the radiation source 400 onto a mask 330 secured on a mask stage 320.

In some embodiments, the mask stage 320 includes an electrostatic chuck (e-chuck) used to secure the mask 330. In this context, the terms mask, photomask, and reticle are used interchangeably. In the present embodiment, the mask 330 is a reflective mask. In some embodiments, the mask 330 may be the masks 10 and 20 as described in FIGS. 1 to 14.

The EUV lithography system 300 also includes a projection optics module (or projection optics box (POB)) 340 for imaging the pattern of the mask 330 onto a semiconductor substrate W (e.g., wafer) secured on a substrate stage (e.g., wafer stage) 350 of the EUV lithography system 300. The POB 340 includes reflective optics in the present embodiment. The EUV light EL that is directed from the mask 330 and carries the image of the pattern defined on the mask 330 is collected by the POB 340. The illuminator 310 and the POB 340 may be collectively referred to as an optical module of the EUV lithography system 300. In the present embodiment, the semiconductor substrate W is a semiconductor wafer, such as a silicon wafer or other type of wafer to be patterned. The semiconductor substrate W is coated with a resist layer sensitive to the EUV light EL in the present embodiment. Various components including those described above are integrated together and are operable to perform EUV lithography exposing processes.

Figure 16:
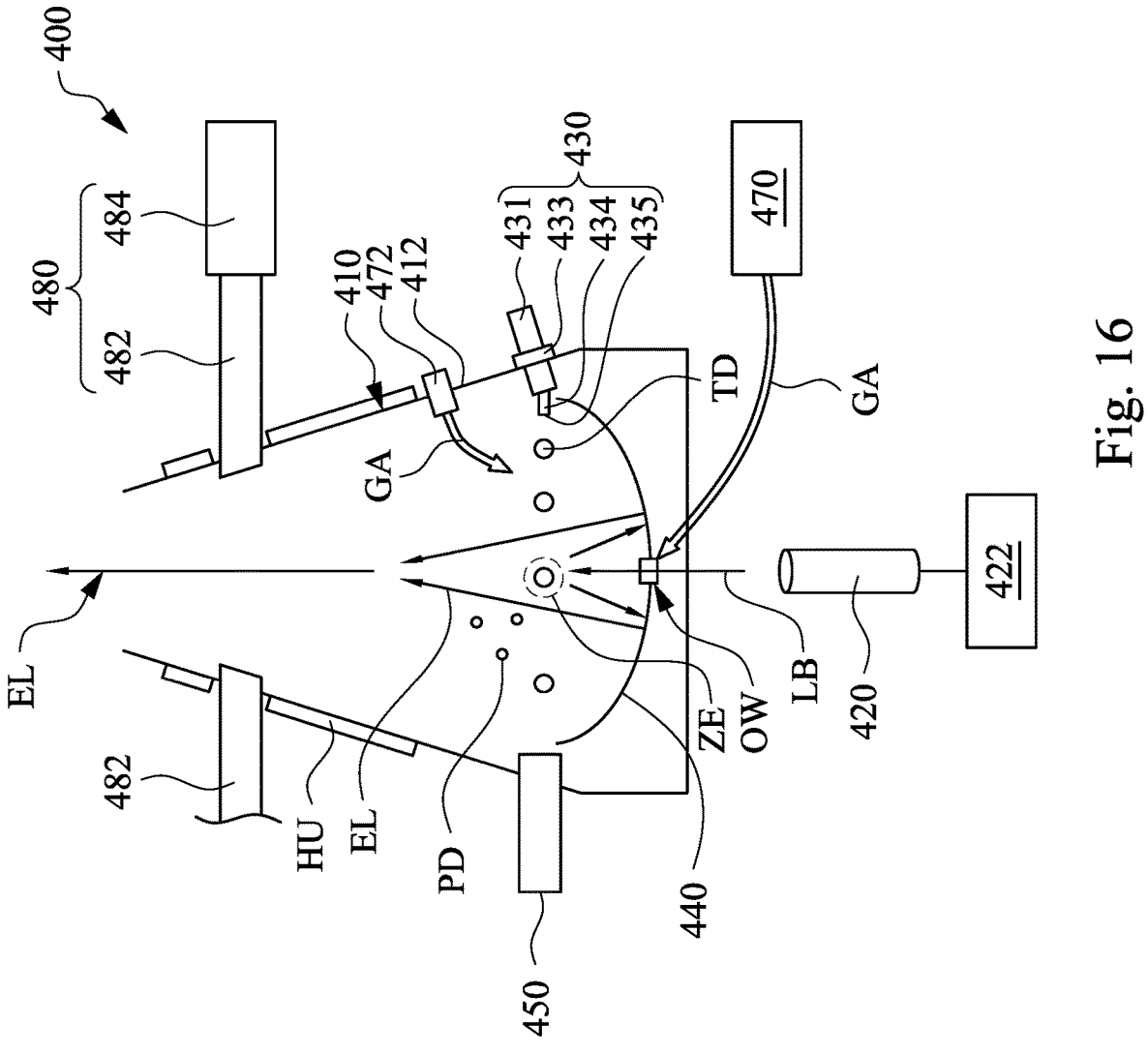
FIG. 16 is a schematic view of an EUV radiation source according to some embodiments of the present disclosure.

FIG. 16 is a schematic view of an EUV radiation source 400 according to some embodiments of the present disclosure. The radiation source 400 employs a laser produced plasma (LPP) mechanism to generate plasma and further generate EUV light from the plasma. The radiation source 400 includes a vessel 410, a laser source 420, a target droplet generator 430, a collector 440, and a droplet catcher 450.

In some embodiments, the target droplets TD are metal droplets, such as droplets of tin (Sn), lithium (Li), or an alloy of Sn and Li. In some embodiments, the target droplets TD each have a diameter in a range from about 10 microns (μm) to about 100 μm. For example, in an embodiment, the target droplets TD are tin droplets, having a diameter of about 10 μm to about 100 μm. In other embodiments, the target droplets TD are tin droplets having a diameter of about 25 μm to about 50 μm. In some embodiments, the target droplets TD are supplied through a nozzle 435 of the droplet generator 430 at a rate in a range from about 50 droplets per second (i.e., an ejection-frequency of about 50 Hz) to about 50,000 droplets per second (i.e., an ejection-frequency of about 50 kHz). In some embodiments, the target droplets TD are supplied at an ejection-frequency of about 100 Hz to about 25 kHz. In other embodiments, the target droplets TD are supplied at an ejection frequency of about 500 Hz to about 10 kHz. The target droplets TD are ejected through the nozzle 435 and into a zone of excitation ZE at a speed in a range of about 10 meters per second (m/s) to about 100 m/s in some embodiments. In some embodiments, the target droplets TD have a speed of about 10 m/s to about 75 m/s. In other embodiments, the target droplets TD have a speed of about 25 m/s to about 50 m/s.

In some embodiments, an excitation laser LB generated by the excitation laser source 420 is a pulse laser. The excitation laser LB is generated by the excitation laser source 420. In some embodiments, the laser source 420 includes a carbon dioxide ($CO_2$) or a neodymium-doped yttrium aluminum garnet (Nd:YAG) laser source with a wavelength in the infrared region of the electromagnetic spectrum. For example, the laser source 420 has a wavelength of 9.4 μm or 10.6 μm, in an embodiment.

In some embodiments, the excitation laser LB includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In some embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In some embodiments, the pre-heat laser and the main laser have an average power in the range from about 1 kilowatt (kW) to about 50 kW. The pulse-frequency of the excitation laser LB is matched with the ejection-frequency of the target droplets TD in some embodiments.

The excitation laser LB is directed through a window OW in the collector 440 into the zone of excitation ZE. The window OW is made of a suitable material substantially transparent to the excitation laser LB. The generation of the pulse lasers is synchronized with the ejection of the target droplets TD through the nozzle 435. As the target droplets TD move through the excitation zone ZE, the pre-pulses heat the target droplets TD and transform them into low-density target plumes. A delay between the pre-pulse and the main pulse is controlled to allow the target plume to form and to expand to an optimal size and geometry. In some embodiments, the pre-pulse and the main pulse have the same pulse-duration and peak power. When the main pulse heats the target plume, a high-temperature plasma is generated. The plasma emits EUV radiation EL, which is collected by the collector 440. The collector 440 further reflects and focuses the EUV radiation EL toward the illuminator 310 (as shown in FIG. 15) for the lithography exposing processes. The droplet catcher 450 is used for catching excessive target droplets. For example, some target droplets may be purposely missed by the laser pulses.

In some embodiments, the collector 440 is designed with a proper coating material and shape to function as a mirror for EUV collection, reflection, and focusing. In some embodiments, the collector 440 is designed to have an ellipsoidal geometry. In some embodiments, the coating material of the collector 440 is similar to the reflective multilayer of the EUV mask 330 (as shown in FIG. 15). In some embodiments, the coating material of the collector 440 includes a ML (such as one or more Mo/Si film pairs) and may further include a capping layer (such as Ru) coated on the ML to substantially reflect the EUV light EL. In some embodiments, the collector 440 may further include a grating structure designed to effectively scatter the laser beam directed onto the collector 440. For example, a silicon nitride layer is coated on the collector 440 and is patterned to have a grating pattern.

In some embodiments, the high-temperature plasma may cool down and become vapors or small particles (collectively, debris) PD. The debris PD may deposit onto the surface of the collector 440, thereby causing contamination thereon. Over time, the reflectivity of the collector 440 degrades due to debris accumulation and other factors such as ion damages, oxidation, and blistering. Once the reflectivity is degraded to a certain degree, the collector 440 reaches the end of its usable lifetime and may need to be swapped out (i.e., replaced with a new collector).

The vessel 410 has a cover 412 for ventilation and for collecting debris PD. In some embodiments, the cover 412 is made of a suitable solid material, such as stainless steel. The cover 412 is designed and disposed around the collector 440. The cover 412 may include a plurality of vanes, which are evenly spaced around the cone-shaped cover 412. In some embodiments, the radiation source 400 further includes a heating unit HU disposed around part of the cover 412. The heating unit HU functions to maintain the temperature inside the cover 412 above a melting point of the debris PD so that the debris PD does not solidify on the inner surface of the cover 412. When the debris PD vapor comes in contact with the vanes, it may condense into a liquid form and flow into a lower section of the cover 412. The lower section of the cover 412 may provide holes (not shown) for draining the debris liquid out of the cover 412.

In some embodiments, a buffer gas GA is supplied from a first buffer gas supply 470 through the aperture in collector 440 by which the pulse laser is delivered to the tin droplets. In some embodiments, the buffer gas is H2, He, Ar, N2 or another inert gas. In certain embodiments, H radicals generated by ionization of the H2 buffer gas is used for cleaning purposes. The buffer gas GA can also be provided through one or more second buffer gas supplies 272 toward the collector 440 and/or around the edges of the collector 440. Further, the vessel 410 further includes an exhaust system 280 so that the buffer gas is exhausted outside the vessel 410.

Hydrogen gas has low absorption to the EUV radiation. Hydrogen gas reaching the coating surface of the collector 440 reacts chemically with a metal of the droplet forming a hydride, e.g., metal hydride. When tin (Sn) is used as the droplet TD, stannane (SnH$_4$), which is a gaseous byproduct of the EUV generation process, is formed. The gaseous SnH$_4$ is then pumped out through the exhaust system 480.

The buffer gas GA is provided for various protection functions, which include effectively protecting the collector 440 from the contaminations by tin particles. Other suitable gas may be alternatively or additionally used. The gas GA may be introduced into the collector 440 through openings (or gaps) near the output window OW through one or more gas pipelines. The exhaust system 480 includes one or more exhaust lines 482 and one or more pumps 484. The exhaust line 482 is connected to the wall of the vessel 410 for receiving the exhaust. In some embodiments, the cover 412 is designed to have a cone shape with its wide base integrated with the collector 440 and its narrow top section facing the illuminator 310 (FIG. 15). To further these embodiments, the exhaust line 482 is connected to the cover 412 at its top section. Installing the exhaust line 482 at the top section of the cover 412 helps exhaust the debris PD out of the space defined by the collector 440 and the cover 412. The space in the vessel 410 is maintained in a vacuum environment since the air absorbs the EUV radiation.

Based on the above discussions, it can be seen that the present disclosure offers advantages. It is understood, however, that other embodiments may offer additional advantages, and not all advantages are necessarily disclosed herein, and that no particular advantage is required for all embodiments. Embodiments provide a mask, in which a chemically stable layer is formed over a reflective multilayer of the mask. The chemically stable layer can be formed by performing a surface pre-treatment or a doping process to a capping layer. In other embodiments, the chemically stable layer can be a joining layer formed over a capping layer of the mask, in which the joining layer may be a nitride layer or a fluoride layer. On advantage is that the durability of the capping layer can be improved by stabilizing the capping layer or inserting a joining layer to against oxidation and intermixing between the capping layer during the top absorption layer deposition.

In some embodiments of the present disclosure, a method includes forming a reflective multilayer over a substrate; depositing a first capping layer over the reflective multilayer, wherein the first capping layer is made of a ruthenium-containing material or a chromium-containing material; performing a treatment to the first capping layer to introduce nitrogen or fluorine into the first capping layer; forming an absorption layer over the first capping layer; and patterning the absorption layer.

In some embodiments, the treatment comprises a nitridation process or a fluorination process.

In some embodiments, the treatment comprises doping the first capping layer with nitrogen or fluorine.

In some embodiments, the first capping layer comprises ruthenium nitride (RuN) or ruthenium fluoride (RuF) after the treatment is completed.

In some embodiments, the treatment is performed during depositing the first capping layer.

In some embodiments, patterning the absorption layer is performed to form recesses in the absorption layer that expose a top surface of the first capping layer.

In some embodiments, the method further includes depositing a second capping layer over the reflective multilayer prior to depositing the first capping layer.

In some embodiments, the second capping layer is also made of a ruthenium-containing material or a chromium-containing material.

In some embodiments, after the treatment is completed, the first capping layer includes a higher atomic concentration of nitrogen or fluorine than the second capping layer.

In some embodiments of the present disclosure, a method includes forming a reflective multilayer over a substrate; forming a first capping layer over the reflective multilayer; forming a second capping layer over the first capping layer, wherein the second capping layer includes a higher atomic concentration of nitrogen or fluorine than the first capping layer; forming an absorption layer over the second capping layer; and patterning the absorption layer.

In some embodiments, forming the second capping layer comprises performing a nitridation or a fluorination process to the second capping layer.

In some embodiments, the second capping layer is a nitride or a fluoride.

In some embodiments, the first and second capping layers are made of ruthenium-containing materials or chromium-containing materials.

In some embodiments, the first and second capping layers comprises a same metal element.

In some embodiments, the second capping layer is a nitride or a fluoride of the first capping layer.

In some embodiments of the present disclosure, a mask includes a substrate, a reflective multilayer over the substrate, a first capping layer over the reflective multilayer, and an absorption layer over the first capping layer. The first, capping layer is made of a ruthenium-containing material or a chromium-containing material, and the first capping layer further comprises nitrogen or fluorine.

In some embodiments, the first capping layer is made of ruthenium nitride (RuN) or ruthenium fluoride (RuF).

In some embodiments, the mask further includes a second capping layer between the first capping layer and the reflective multilayer, wherein the second capping layer are also made of a ruthenium-containing material or a chromium-containing material.

In some embodiments, the first capping layer includes a higher atomic concentration of nitrogen or fluorine than the second capping layer.

In some embodiments, the absorption layer comprises recesses that expose a top surface of the first capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a reflective multilayer over a substrate;

depositing a first capping layer over the reflective multilayer, wherein the first capping layer comprises a ruthenium-containing material or a chromium-containing material;

performing a treatment to the first capping layer to introduce fluorine into the first capping layer;

forming an absorption layer over the first capping layer; and patterning the absorption layer.

2. The method of claim 1, wherein the treatment comprises a nitridation process or a fluorination process.

3. The method of claim 1, wherein the treatment comprises doping the first capping layer with fluorine.

4. The method of claim 1, wherein the first capping layer comprises ruthenium nitride (RUN) or ruthenium fluoride (RuF) after the treatment is completed.

5. The method of claim 1, wherein the treatment is performed during depositing the first capping layer.

6. The method of claim 1, wherein patterning the absorption layer is performed to form recesses in the absorption layer that expose a top surface of the first capping layer.

7. The method of claim 1, further comprising depositing a second capping layer over the reflective multilayer prior to depositing the first capping layer.

8. The method of claim 7, wherein the second capping layer is also made of a ruthenium-containing material or a chromium-containing material.

9. The method of claim 7, wherein after the treatment is completed, the first capping layer includes a higher atomic concentration of fluorine than the second capping layer.

10. A method, comprising:

forming a reflective multilayer over a substrate;

forming a first capping layer over the reflective multilayer, wherein the first capping layer comprises a ruthenium-containing material or a chromium-containing material;

forming a second capping layer over the first capping layer, wherein the second capping layer comprises a ruthenium-containing material or a chromium-containing material, and wherein the second capping layer includes a higher atomic concentration of nitrogen or fluorine than the first capping layer;

forming an absorption layer over the second capping layer; and patterning the absorption layer.

11. The method of claim 10, wherein forming the second capping layer comprises performing a nitridation or a fluorination process to the second capping layer.

12. The method of claim 10, wherein the second capping layer is a nitride or a fluoride.

13. The method of claim 10, wherein the first and second capping layers comprises a same metal element.

14. The method of claim 10, wherein the second capping layer is a nitride or a fluoride of the first capping layer.

15. A mask, comprising:

a substrate;

a reflective multilayer over the substrate;

a first capping layer over the reflective multilayer, wherein the first capping layer comprises a ruthenium-containing material or a chromium-containing material, and the first capping layer further comprises fluorine; and a second capping layer over the first capping layer, wherein the second capping layer also comprises fluorine; and an absorption layer over the second capping layer.

16. The mask of claim 15, wherein the first capping layer comprises ruthenium nitride (RUN) or ruthenium fluoride (RuF).

17. The mask of claim 15, wherein the second capping layer are also made of a ruthenium-containing material or a chromium-containing material.

18. The mask of claim 17, wherein the first capping layer includes a lower atomic concentration of nitrogen than the second capping layer.

19. The mask of claim 17, wherein the absorption layer comprises recesses that expose a top surface of the first capping layer.

20. The mask of claim 15, wherein the a second capping layer is a nitride of a ruthenium-containing material or a chromium-containing material.

* * * * *